United States Patent
Uematsu

(10) Patent No.: US 7,834,429 B2
(45) Date of Patent: Nov. 16, 2010

(54) LEAD FRAME AND METHOD OF MANUFACTURING THE SAME AND SEMICONDUCTOR DEVICE

(75) Inventor: Etsuo Uematsu, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 563 days.

(21) Appl. No.: 11/798,225

(22) Filed: May 11, 2007

(65) Prior Publication Data

US 2007/0278633 A1 Dec. 6, 2007

(30) Foreign Application Priority Data

Jun. 1, 2006 (JP) .............................. 2006-153532

(51) Int. Cl.
*H01L 23/495* (2006.01)
*H01L 23/48* (2006.01)
(52) U.S. Cl. ................ 257/666; 257/784; 257/E23.031
(58) Field of Classification Search ................. 257/666, 257/676, E23.031, 784
See application file for complete search history.

(56) References Cited

U.S. PATENT DOCUMENTS

| | | | |
|---|---|---|---|
| 5,498,901 A * | 3/1996 | Chillara et al. .............. | 257/666 |
| 5,543,657 A | 8/1996 | Diffenderfer et al. | |
| 5,723,899 A * | 3/1998 | Shin ........................... | 257/666 |
| 5,814,877 A * | 9/1998 | Diffenderfer et al. ........ | 257/666 |
| 6,104,084 A | 8/2000 | Ishio et al. .................. | 257/666 |
| 6,265,760 B1 | 7/2001 | Inaba et al. ................. | 257/666 |
| 6,437,427 B1 * | 8/2002 | Choi ........................... | 257/666 |
| 6,774,479 B2 * | 8/2004 | Schatzler et al. ............ | 257/695 |
| 7,242,077 B2 * | 7/2007 | Ma et al. ..................... | 257/670 |

FOREIGN PATENT DOCUMENTS

| | | |
|---|---|---|
| JP | 6-252328 | 9/1994 |
| JP | 8-125094 | 5/1996 |
| JP | 2000-31370 | 1/2000 |
| JP | 2001-24138 | 1/2001 |

OTHER PUBLICATIONS

Singapore Examination Report dated Mar. 20, 2009.

* cited by examiner

*Primary Examiner*—Nitin Parekh
(74) *Attorney, Agent, or Firm*—Kratz, Quintos & Hanson, LLP

(57) ABSTRACT

In the lead frame of the present invention, a common wiring portion (ground ring) is arranged around a die pad at a predetermined interval to be connected partially to the die pad, projection portions projected toward the die pad side are provided to side portions of the common wiring portion, a plurality of leads are provided away from the common wiring portion to extend outward from a periphery of the common wiring portion, and the projection portions of the common wiring portion are pressed partially by the die upon cutting off the leads from the common wiring portion by a die.

12 Claims, 16 Drawing Sheets

In the case that the ground ring is pressed tightly

In the case that the ground ring is pressed loosely

LEAD FRAME AND METHOD OF MANUFACTURING THE SAME AND SEMICONDUCTOR DEVICE

CROSS-REFERENCE TO RELATED APPLICATIONS

This application is based on and claims priority of Japanese Patent Application No. 2006-153532 filed on Jun. 1, 2006, the entire contents of which are incorporated herein by reference.

BACKGROUND OF THE INVENTION

1. Field of the Invention

The present invention relates to a lead frame and a method of manufacturing the same and a semiconductor device and, more particularly, a lead frame to which a common wiring portion such as a ground ring, or the like is provided around a die pad and a method of manufacturing the same and a semiconductor device using the lead frame.

2. Description of the Related Art

In the prior art, in some plastic package using the lead frame, the common wiring portion connected to the die pad for the purpose of grounding, or the like is provided like a ring around the die pad onto which the semiconductor chip is mounted.

In such lead frame manufacturing method, as shown in FIG. 1, first, a pattern-shaped metal plate 200a is prepared. In this pattern-shaped metal plate 200a, a ground ring 120 is arranged around a quadrangular die pad 100 and inner leads 140 connected to the ground ring 120 are formed on the outside of the ground ring 120 to extend outward. Outer leads (not shown) connected to the inner leads 140 via a dam bar (not shown) are formed on the outside of the inner leads 140. A support bar 160 extended from an outer frame (not shown) is connected to four corners of the die pad 100 and the ground ring 120 respectively, and the die pad 100 and the ground ring 120 are supported by the support bars 160.

Then, a metal plating layer (not shown) for the wire bonding is formed selectively on the ground ring 120 and the inner leads 140 of the pattern-shaped metal plate 200a. In the lead frame having the ground ring, the ground ring 120 and the inner leads 140 are separated finally. In this case, not to produce defects such as a deformation of the inner leads 140 in the plating step applied to form the metal plating layer, the plating process is carried out in a state that the inner leads 140 are fixed to be connected to the ground ring 120.

Then, as shown in FIG. 2, a die having a supporting member 300, a pressing member 320, and a punch 340 is prepared, and then the pattern-shaped metal plate 200a of FIG. 1 is placed in the die. Then, root portions B of the inner leads 140 connected to the ground ring 120 are pushed and punched by the punch 340 in a state that the ground ring 120 and the inner leads 140 are put between the supporting member 300 and the pressing member 320 to apply a pressure. Thus, as shown in FIG. 3, all the inner leads 140 are cut off from four sides of the ground ring 120 of the pattern-shaped metal plate 200a of FIG. 1. Accordingly, a lead frame 200 having the ground ring 120 can be obtained.

Then, a semiconductor chip (not shown) is mounted on the die pad 100 of the lead frame 200 in FIG. 3, then the semiconductor chip is electrically connected to the ground ring 120 and the inner leads 140 by the wire bonding respectively, and then the semiconductor chip is sealed with a resin. The lead frame 200 is cut off from the outer frame at a predetermined timing, and the bending is applied to the lead frame 200.

The technology associated with the lead frame having the ground ring is set forth in Patent Literature 1 (Patent Application Publication (KOKAI) Hei 6-252328) and Patent Literature 2 (Patent Application Publication (KOKAI) Hei 8-125094), for example.

Also, in Patent Literature 3 (Patent Application Publication (KOKAI) 2000-31370), it is set forth that the, in forming a slope in the stage support bar connected to the stage portion of the lead frame, upper and lower surfaces of the bar are held by a holding means respectively and the holding means are moved relatively in the direction perpendicular to the lead forming surface, so that a slope piece portion stretched uniformly by the stretching is formed.

In the above lead frame manufacturing method in the prior art, when the inner leads 140 are cut off from the ground ring 120 by the die, the problems exist as follows. As shown in FIG. 4A, in the case that the ground ring 120 is pressed tightly by the pressing member 320, the inner leads 140 can be cut off satisfactorily without occurring of a twist due to an inclination of the ground ring 120, nevertheless a surface (metal plating layer) of the ground ring 120 is easily scratched by the pressing member 320 and the supporting member 300. Thus, reliability in connecting the semiconductor chip and the ground ring 120 by the wire bonding is lowered.

Conversely, as shown in FIG. 4B, in the case that the ground ring 120 is pressed loosely by the pressing member 320, generation of the scratch on the surface of the ground ring 120 can be improved, nevertheless a twist is easily caused because the ground ring 120 is inclined. Thus, reliability in executing the wire bonding is lowered similarly.

SUMMARY OF THE INVENTION

It is an object of the present invention to provide a lead frame having such a structure that, in the lead frame obtained by cutting off leads, which are connected to a common wiring portion arranged around a die pad and are formed to extend outward, from the common wiring portion, the leads can be cut off from the common wiring portion without any trouble of the common wiring portion and a method of manufacturing the same and a semiconductor device using the lead frame.

The present invention is associated with a lead frame, which includes a die pad; a common wiring portion arranged around the die pad with a predetermined interval, and connected partially to the die pad, and in which projection portions projected toward the die pad side are provided at side portions of the common wiring portion; and a plurality of leads provided to be separated from the common wiring portion, and extending outward from a periphery of the common wiring portion.

In manufacturing the lead frame having the common wiring portion of the present invention, when the metal plating layer for the wire bonding is formed on the common wiring portion and the leads, such plating is carried out not to deform the leads in a state that the leads are connected to the common wiring portion. Therefore, the leads must be cut off from the common wiring portion later. At this time, the projection portions projected to the die pad side are provided previously to the side portions of the common wiring portion, and the leads are cut off by the punch of the die in a state that the projection portions are pressed partially and fixed by the pressing member of the die.

By employing this method, the die does not contact the main body portion of the common wiring portion by doing the above. Therefore, there is no possibility that the surface (metal plating layer) of the common wiring portion is scratched. In addition, since the main body portion of the common wiring portion can be fixed by pressing sufficiently the projection portions of the common wiring portion, there is no possibility that the common wiring portion is inclined to cause a twist. As a result, when the semiconductor device is constructed by using the lead frame of the present invention, the semiconductor chip can be connected to the common wiring portion by the wire bonding using the wires with good reliability.

The common wiring portion may be used for various purposes such as the grounding, the power supply, the signal, or the like. Also, the common wiring portion may be formed like a ring to surround the die pad, otherwise a plurality of common wiring portions may be arranged around the die pad in a state that they are isolated mutually.

In the above present invention, notched portions cutting into an inside may be provided to edge portions of the die pad opposing to the projection portions of the common wiring portion.

Also, in the above present invention, the projection portions of the common wiring portion may be formed by etching a lower surface side to be connected to an upper surface side of the common wiring portion in a thickness direction, and hollow portions may be provided to edge portions of the die pad opposing to the projection portions by etching an upper surface side of the die pad.

According to such constitutions, even if the interval between the die pad and the common wiring portion becomes narrow, the projection portions of a predetermined projected dimension can be easily formed on the side portions of the common wiring portion in a state that the projection portions are separated from the die pad.

As described above, according to the present invention, a projection portion pressed partially by the die is provided to the common wiring portion. Therefore, generation of a scratch or a twist in the common wiring portion can be prevented in cutting off the leads from the common wiring portion by the die, and also reliability in executing the wire bonding can be improved.

DETAILED DESCRIPTION OF THE PREFERRED EMBODIMENTS

Embodiments of the present invention will be explained with reference to the accompanying drawings hereinafter.

First Embodiment

Figure 1:
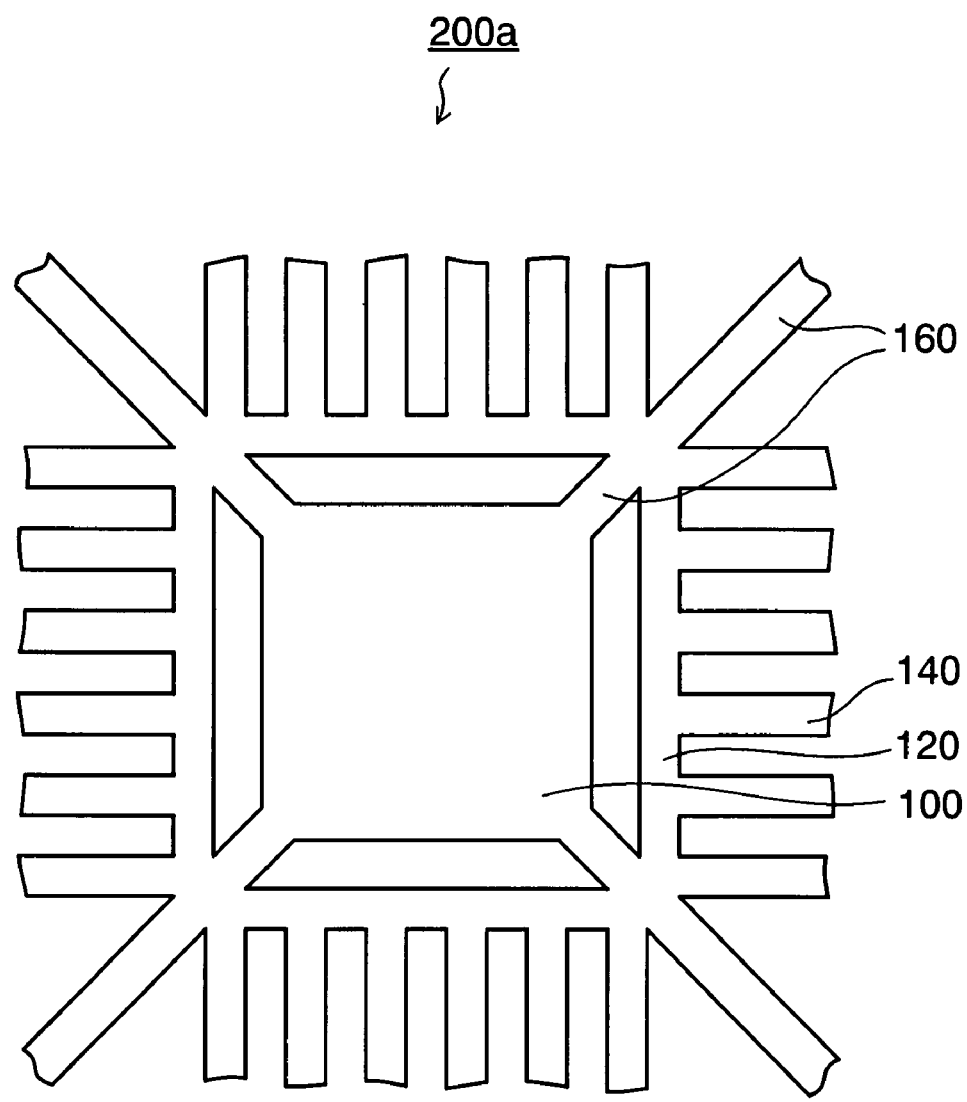
FIG. 1 is a plan view showing a pattern-shaped metal plate to manufacture a lead frame having a ground ring in the prior art.
Figure 2:
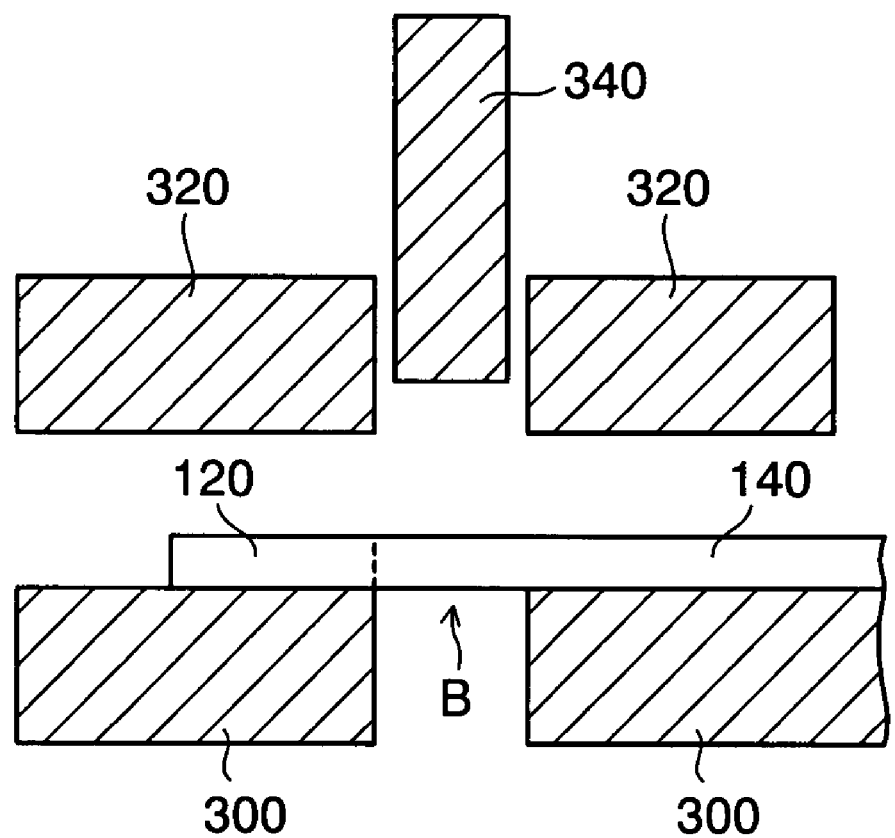
FIG. 2 is a sectional view showing a state to cut off inner leads from the ground ring by a die, in the lead frame manufacturing method in the prior art.
Figure 3:
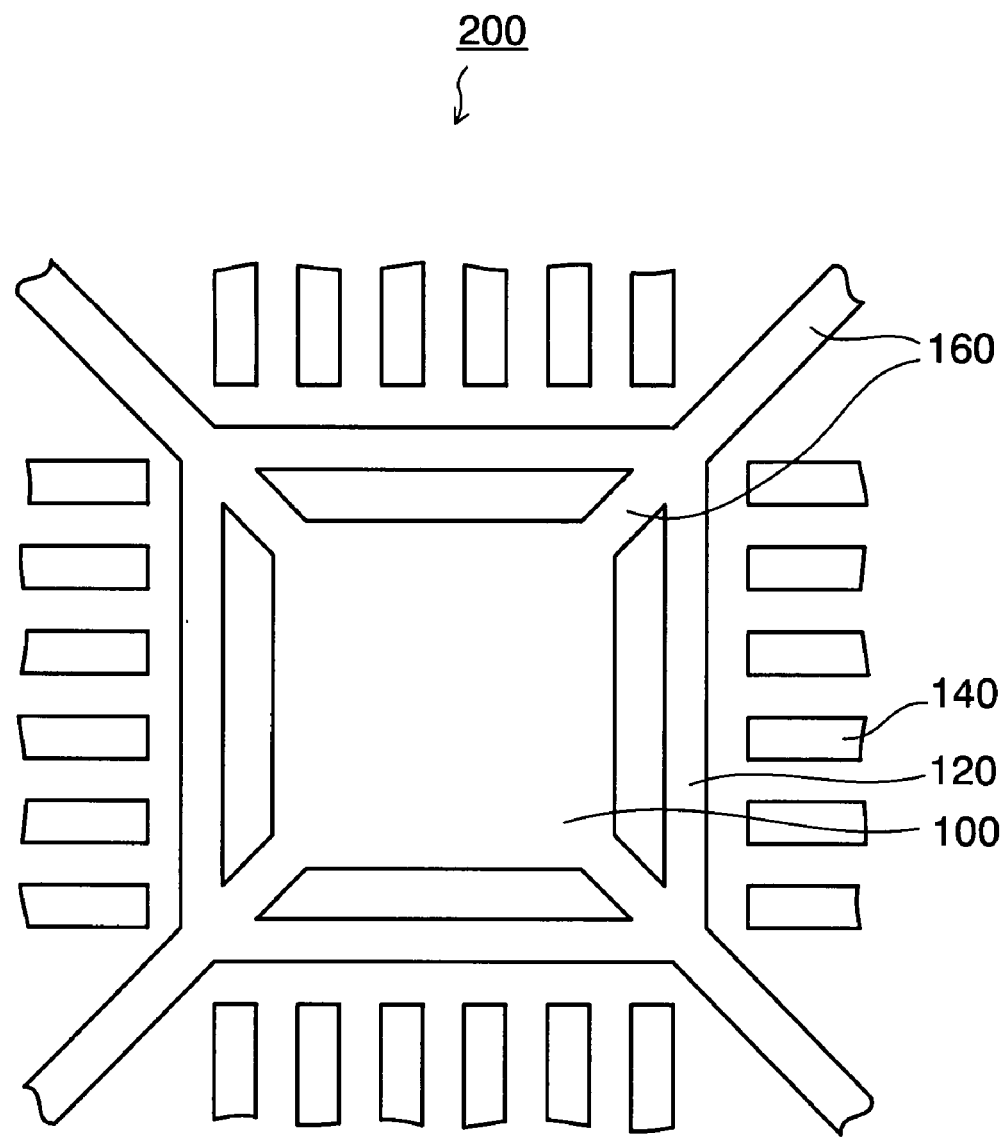
FIG. 3 is a plan view showing a lead frame having the ground ring in the prior art.
Figure 4A:
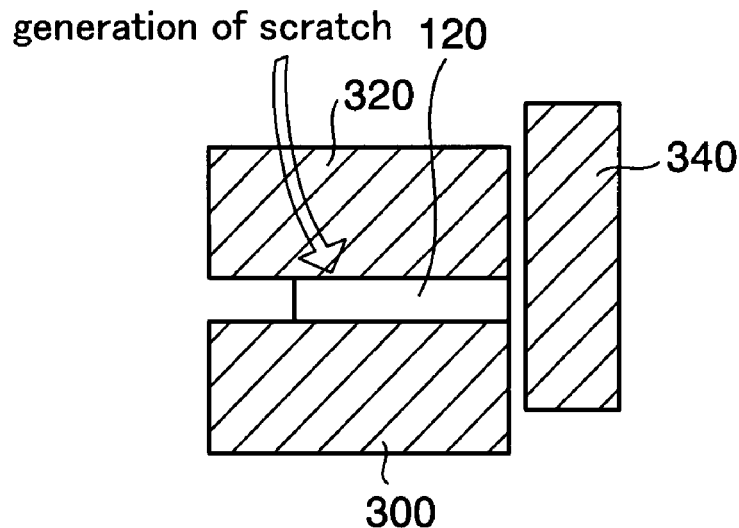
FIGS. 4A and 4B are sectional views explaining a problem caused in cutting off the inner leads from the ground ring in the lead frame manufacturing method in the prior art.
Figure 4B:
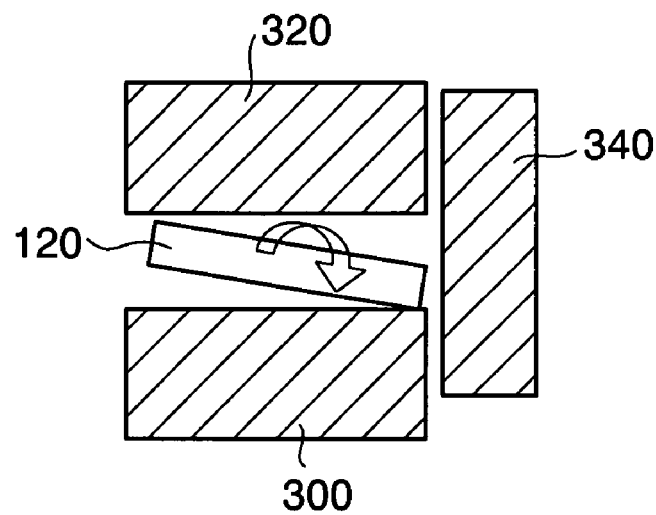
Figure 5:
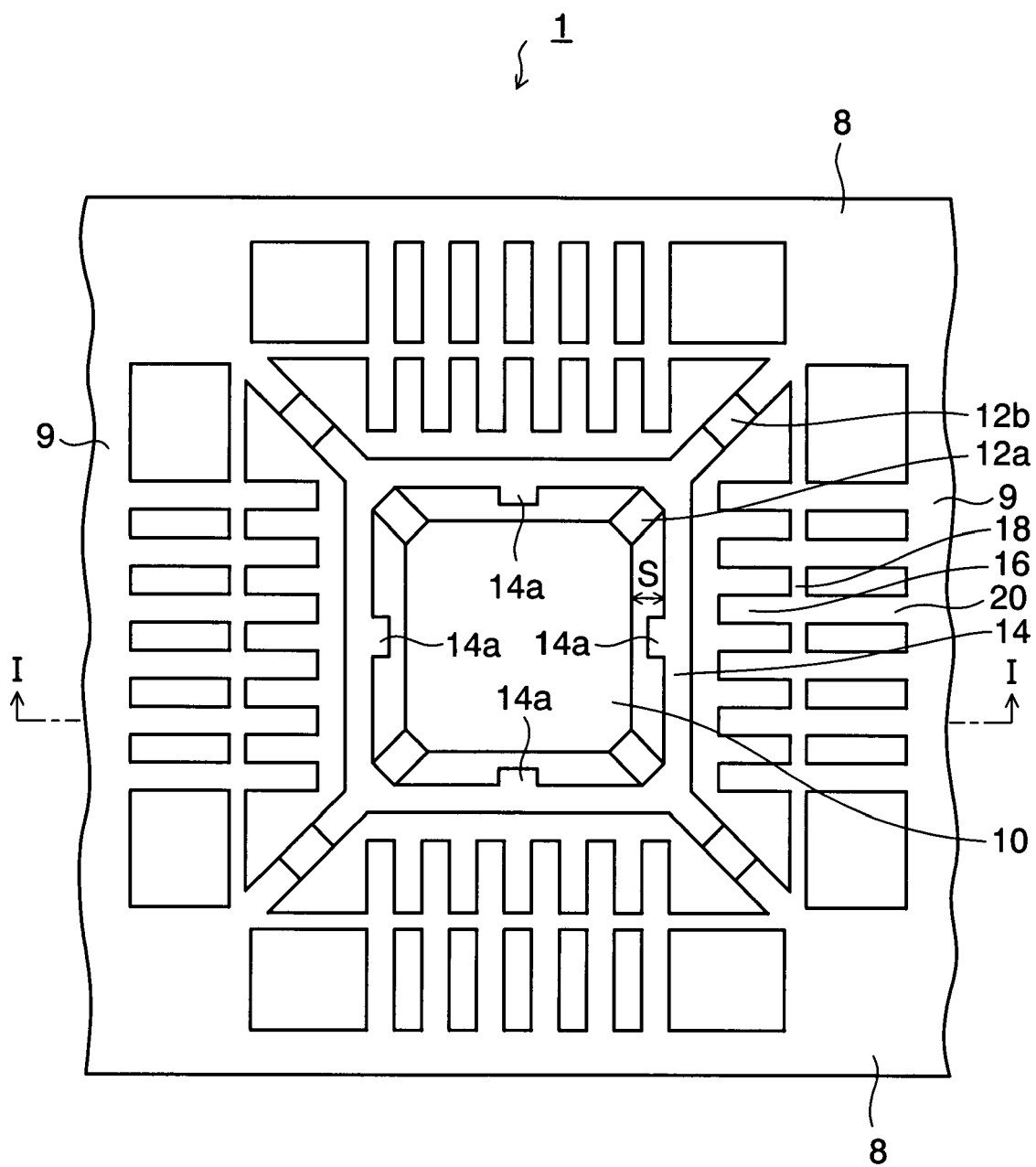
FIG. 5 is a plan view showing a lead frame according to a first embodiment of the present invention.
Figure 6:
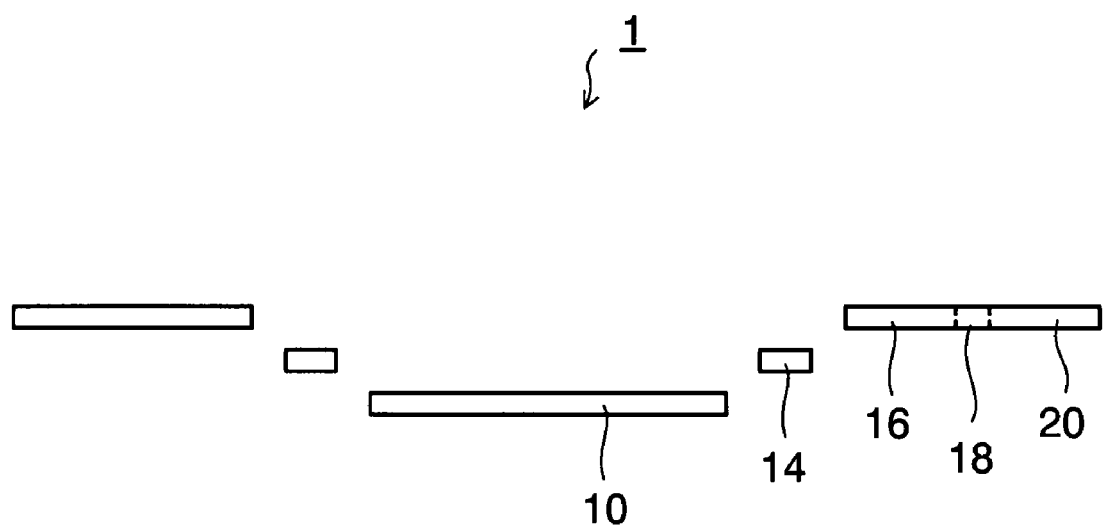
FIG. 6 is a sectional view taken along an I-I line in FIG. 5.
Figure 7:
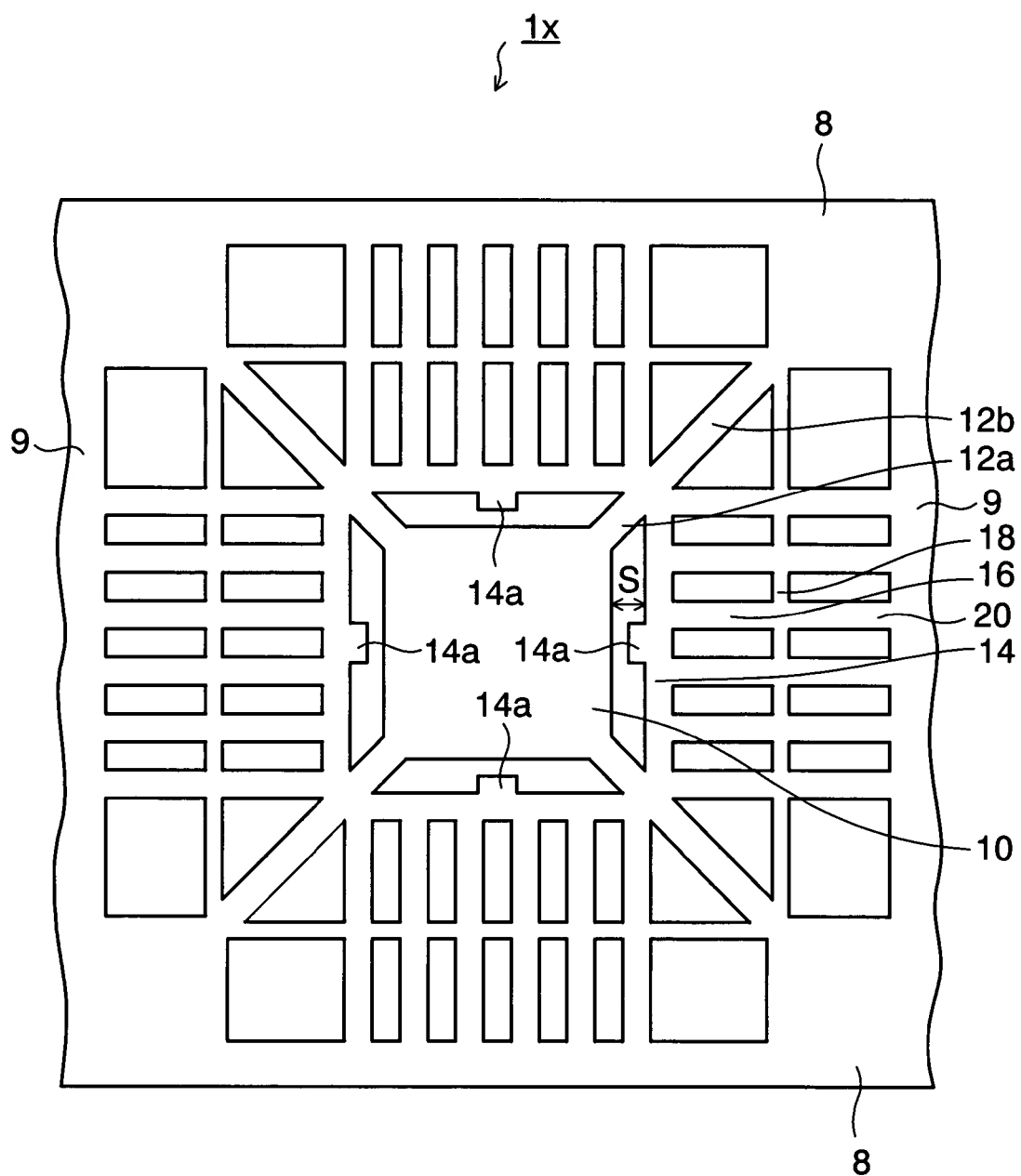
FIG. 7 is a plan view showing a pattern-shaped metal plate to manufacture the lead frame according to the first embodiment of the present invention.
Figure 8A:
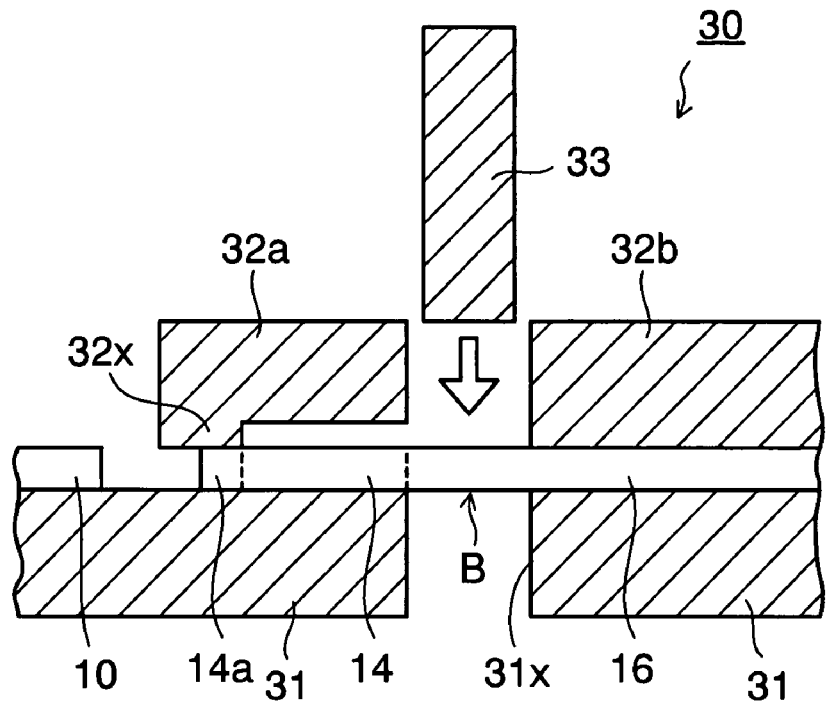
FIGS. 8A and 8B are sectional views showing a state to cut off inner leads from a ground ring by a die, in the lead frame manufacturing method according to the first embodiment of the present invention.
Figure 8B:
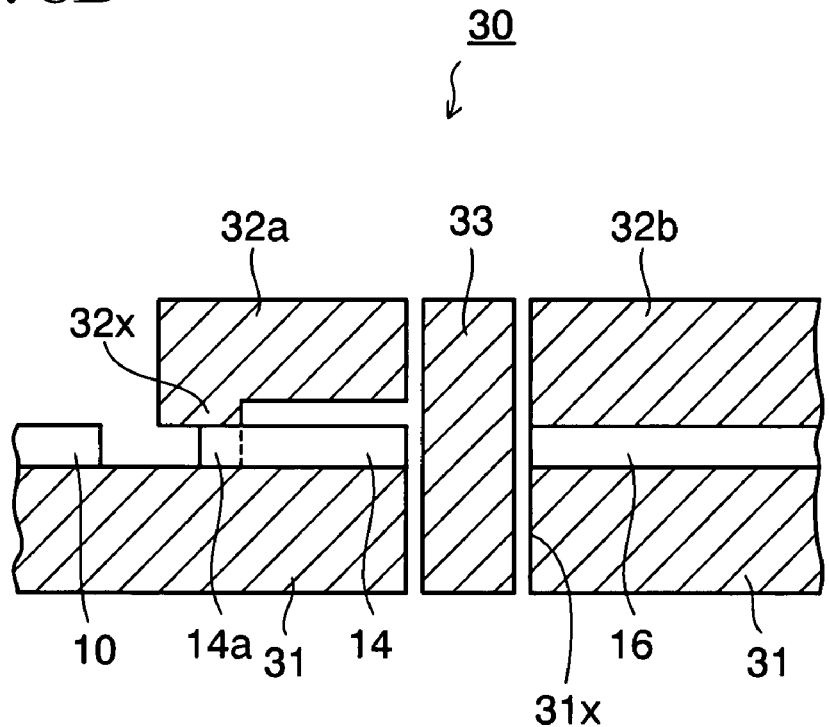

FIG. 5 is a plan view showing a lead frame according to a first embodiment of the present invention, FIG. 6 is a sectional view taken along an I-I line in FIG. 5, FIG. 7 is a plan view showing a pattern-shaped metal plate to manufacture the lead frame, and FIGS. 8A and 8B are sectional views showing a state to cut off inner leads from a ground ring by a die in the lead frame manufacturing steps.

As shown in FIG. 5, a lead frame 1 of the first embodiment of the present invention is formed as a frame structure that is constructed by a pair of outer frames 8 extending in parallel, and a pair of inner frames 9 connected orthogonally to a pair of outer frames 8. A quadrangular die pad 10 is arranged in a center portion of this frame structure, and inner support bars 12a connected to four corners of the die pad 10 to extend outward are formed at four corners of the die pad 10 respectively. A quadrangular ground ring 14 (common wiring portion) is arranged around the die pad 10 at a predetermined interval S. The inner support bars 12a are connected to four corners on the inside of the ground ring 14 respectively, and the ground ring 14 is coupled to the die pad 10 via the inner support bars 12a.

Also, outer support bars 12b are formed at four corners of the ground ring 14 to extend outward, and the outer support bars 12b are connected to the outer frames 8. In this manner, the die pad 10 and the ground ring 14 are connected to the outer frames 8 by the inner and outer support bars 12a, 12b and supported by them.

Also, a plurality of inner leads 16 are formed on the outside of the ground ring 14 to extend outward in a state that they are isolated from the ground ring 14. Respective inner leads 16 are connected to a dam bar 18, and a plurality of outer leads 20 connected to the dam bar 18 to correspond to the inner leads 16 are formed to extend outward. The dam bar 18 is connected to the outer frames 8 and supported by them, and the outer leads 20 are connected to the inner frames 9 and supported by them. In this way, the inner leads 16 are supported by the outer frames 8 and the inner frames 9 via the dam bar 18 and the outer leads 20.

The inner support bars 12a for connecting the die pad 10 and the ground ring 14 are inclined to be bent at a connecting portion between the die pad 10 and the ground ring 14. As shown in FIG. 6 (sectional view taken along an I-I line in FIG. 5), the ground ring 14 is arranged in a position higher than the die pad 10. Also, the outer support bars 12b for connecting the ground ring 14 and the outer frame 8 are inclined to be bent. As shown in FIG. 6, the inner leads 16, the dam bar 18, and the outer leads 20 are arranged in positions higher than the ground ring 14.

Also, a metal plating layer (not shown) made of silver (Ag), nickel (Ni)/palladium (Pd), or the like and used for the wire bonding is partially formed on respective upper surfaces and side surfaces of the ground ring 14 and the inner leads 16. Also, a projection portion 14a projected to the die pad 10 side is provided to each inner center portion of four sides of the ground ring 14. A projected dimension of the projection portion 14a of the ground ring 14 is set to almost 0.05 to 0.1 mm, and a width thereof is set to almost 0.3 to 1 mm.

As explained later, upon cutting off the inner leads 16 connected to the ground ring 14 by the stamping using the die in the manufacturing step, the projection portions 14a are pressed partially by the pressing member of the die. That is, upon cutting off the inner leads 16 from the ground ring 14 by the die, the inner leads 16 are separated under a condition that the projection portions 14a are pressed partially and fixed not to touch a main body portion of the ground ring 14. As a result, a main body surface (metal plating layer) of the ground ring 14 is not scratched, and a surface condition similar to the condition immediately after forming the metal plating layer and suitable for the wire bonding can be maintained.

Here, positions of the projection portions 14a of the ground ring 14 can be set arbitrarily. Also, a plurality of projection portions 14a may be provided to one side of the ground ring 14.

Also, in the present embodiment, the ground ring 14 is illustrated as the common wiring portion provided around the die pad 10. In addition to the grounding means, a power ring for a power supply, a bus bar for a signal, or the like may be used as the common wiring portion. Also, the ground ring 14 constructed to be arranged at a circumference of the die pad 10 in a state that the whole is connected is illustrated. In this case, a plurality of ground bars separated mutually may be arranged around the die pad 10.

Next, the lead frame manufacturing method of the present embodiment will be explained hereunder. As shown in FIG. 7, first, a pattern-shaped metal plate 1x in which the inner leads 16 are connected to the ground ring 14 and the inner and outer support bars 12a, 12b are not bent in the above lead frame 1 in FIG. 5 is prepared. In FIG. 7, remaining portions are similar to those in FIG. 5, and therefore explanation of remaining portions will be omitted herein by affixing the same reference symbols to them.

The pattern-shaped metal plate 1x in FIG. 7 is manufactured by patterning a metal plate such as a copper (Cu) alloy plate, or the like by the stamping using the die or the photolithography and the etching. Then, the pattern-shaped metal plate 1x is arranged on a lower mask material (not shown), and then an upper mask material (not shown) in which opening portions are provided in areas corresponding to the ground ring 14 and the inner leads 16 is formed on the pattern-shaped metal plate 1x. Then, a metal plating layer (not shown) is formed on respective upper surfaces and side surfaces of the ground ring 14 and the inner leads 16 by applying a metal plating such as silver (Ag), nickel (Ni)/palladium (Pd), or the like. In this case, the areas in which the metal plating layer is formed are not limited, and the metal plating layer may be formed in desired areas. Then, a fixing tape is pasted on the inner leads 16 as the case may be.

Then, as shown in FIG. 8A, a die 30 having a supporting member 31 in which opening portions 31x are formed, a first pressing member 32a and a second pressing member 32b, and a punch 33 is prepared. Then, the pattern-shaped metal plate 1x shown in FIG. 7 is placed on the supporting member 31 of the die 30. At this time, root portions B of the inner leads 16 connected to the ground ring 14 are placed to correspond to the opening portions 31x of the supporting member 31. Also, the above projection portions 14a of the ground ring 14 are pressed partially by the first pressing member 32a. Also, convex pressing portions 32x are provided to a lower surface of the first pressing member 32a in positions corresponding to the projection portions 14a of the ground ring 14 such a way that only the projection portions 14a of the ground ring 14 can be pressed upon pressing the pattern-shaped metal plate 1x. Since a lower surface of the first pressing member 32a except the convex pressing portions 32x is arranged higher than a lower surface of the convex pressing portions 32x, the main body portion of the ground ring 14 except the projection portions 14a is set not to touch the first pressing member 32a. Also, the areas of the inner leads 16 side are pressed by the second pressing member 32b.

Then, as shown in FIG. 8B, the root portions B of the inner leads 16 are punched out by moving the punch 33 downward in a condition that the pattern-shaped metal plate 1x placed on the supporting member 31 is pressed and fixed sufficiently by the first and second pressing members 32a, 32b.

At this time, since the main body portion of the ground ring 14 except the projection portions 14a is not pressed by the first pressing member 32a, there is no possibility that the main body surface (the metal plating layer) of the ground ring 14 is scratched. Also, since the root portions B of the inner leads 16 are punched out in a condition that the projection portions 14a of the ground ring 14 are pressed and fixed sufficiently by the first pressing member 32a, there is no possibility that the ground ring 14 is inclined to cause a twist.

In this manner, in the present embodiment, the main body portion of the ground ring 14 except the projection portions 14a does not contact the first pressing member 32a upon cutting off the inner leads 16 by the die 30. As a result, a surface condition suitable for the wire bonding and similar to the condition immediately after forming the metal plating layer is formed can be maintained.

Then, the inner support bars 12a for connecting the die pad 10 and the ground ring 14 are bent and also the outer support bars 12b for connecting the ground ring 14 and the outer frames 8 are bent such that the pattern-shaped metal plate 1x from which the inner leads 16 are separated has the above stepped shape shown in FIG. 6. In this case, the inner and outer support bars 12a, 12b can be bent simultaneously by one bending operation.

With the above, the lead frame 1 of the present embodiment shown in FIG. 5 can be obtained.

Figure 9A:
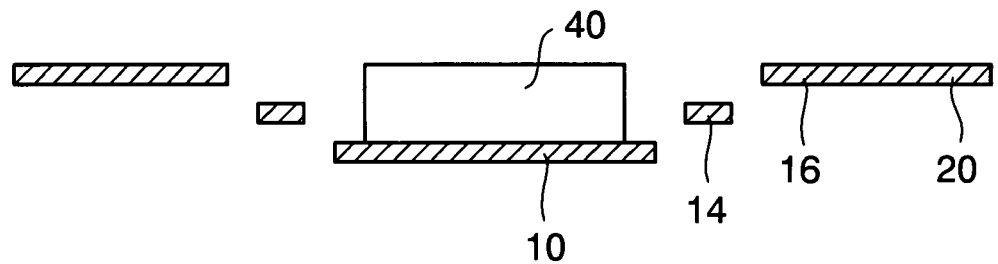
FIGS. 9A to 9D are sectional views showing a method of mounting a semiconductor chip on the lead frame according to the first embodiment of the present invention.
Figure 9B:
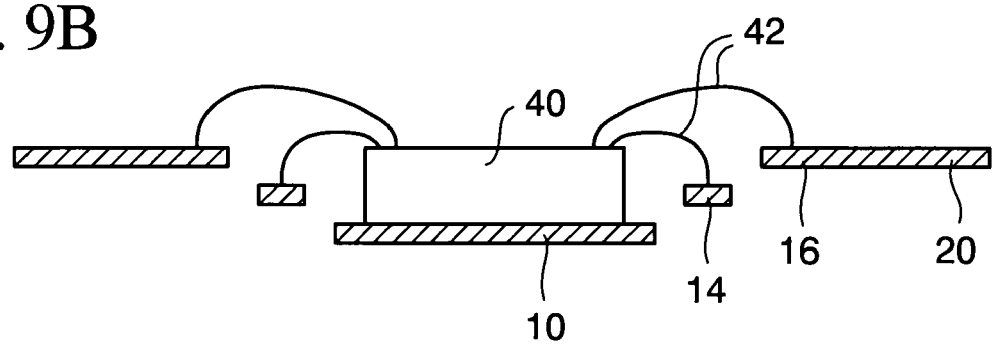

Next, a method of mounting the semiconductor chip on the lead frame 1 of the present embodiment will be explained hereunder. As shown in FIG. 9A, first, the above lead frame 1 of the present embodiment shown in FIG. 6 is prepared, and then a semiconductor chip 40 is adhered onto the die pad 10 by the adhesive to direct its connection electrodes upward (face up). Then, as shown in FIG. 9B, the connection electrodes of the semiconductor chip 40, and the ground ring 14 and the inner leads 16 are connected with wires 42 by the wire bonding respectively.

Figure 9C:
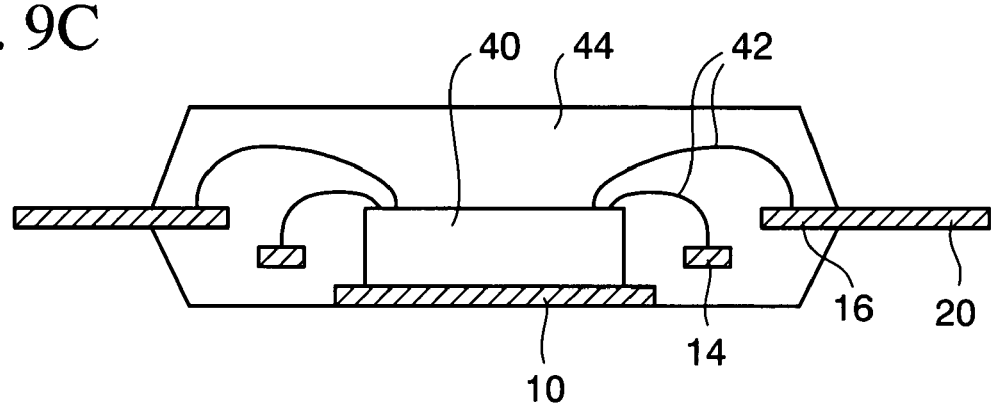

Then, as shown in FIG. 9C, a resin portion 44 for sealing the semiconductor chip 40, the wires 42, the ground ring 14, and the inner leads 16 is formed. At this time, the resin portion 44 is formed such that a lower surface of the die pad 10 and the outer leads 20 are exposed.

Also, a plurality of inner leads 16 and outer leads 20 being separated are obtained by cutting off the outer frames 8 and the inner frames 9 from the lead frame 1 and cutting the dam bar 18.

Figure 9D:
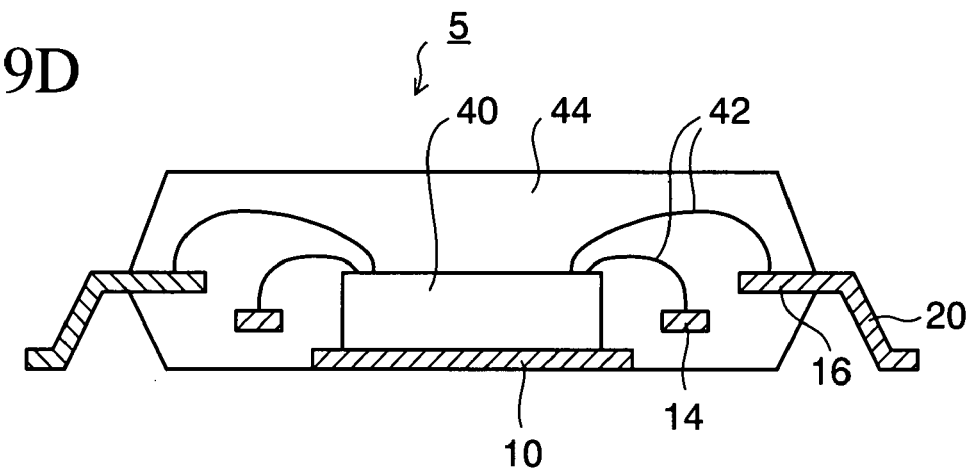

Then, as shown in FIG. 9D, top end portions of the outer leads 20 are formed as outer connection terminals by bending the outer leads 20 exposed from the resin portion 44 downward.

With the above, a semiconductor device 5 of the present embodiment is obtained. As shown in FIG. 9D, in the semiconductor device 5 of the present embodiment, a mounted body is constructed by the die pad 10, the ground ring 14, the inner leads 16, and the outer leads 20 being obtained from the lead frame 1 in FIG. 5. The semiconductor chip 40 is mounted on the die pad 10, and the connection electrodes of the semiconductor chip 40 are connected to the ground ring 14 and the inner leads 16 via the wires 42 respectively. Also, the semiconductor chip 40, the wires 42, and the inner leads 16 are sealed with the resin portion 44 to expose the lower surface of the die pad 10 and the outer leads 20. In the semiconductor device 5 of the present embodiment, since no scratch and twist is generated on a surface (metal plating layer) of the ground ring 14, the semiconductor chip 40 and the ground ring 14 are connected by the wire bonding with good reliability.

Figure 10:
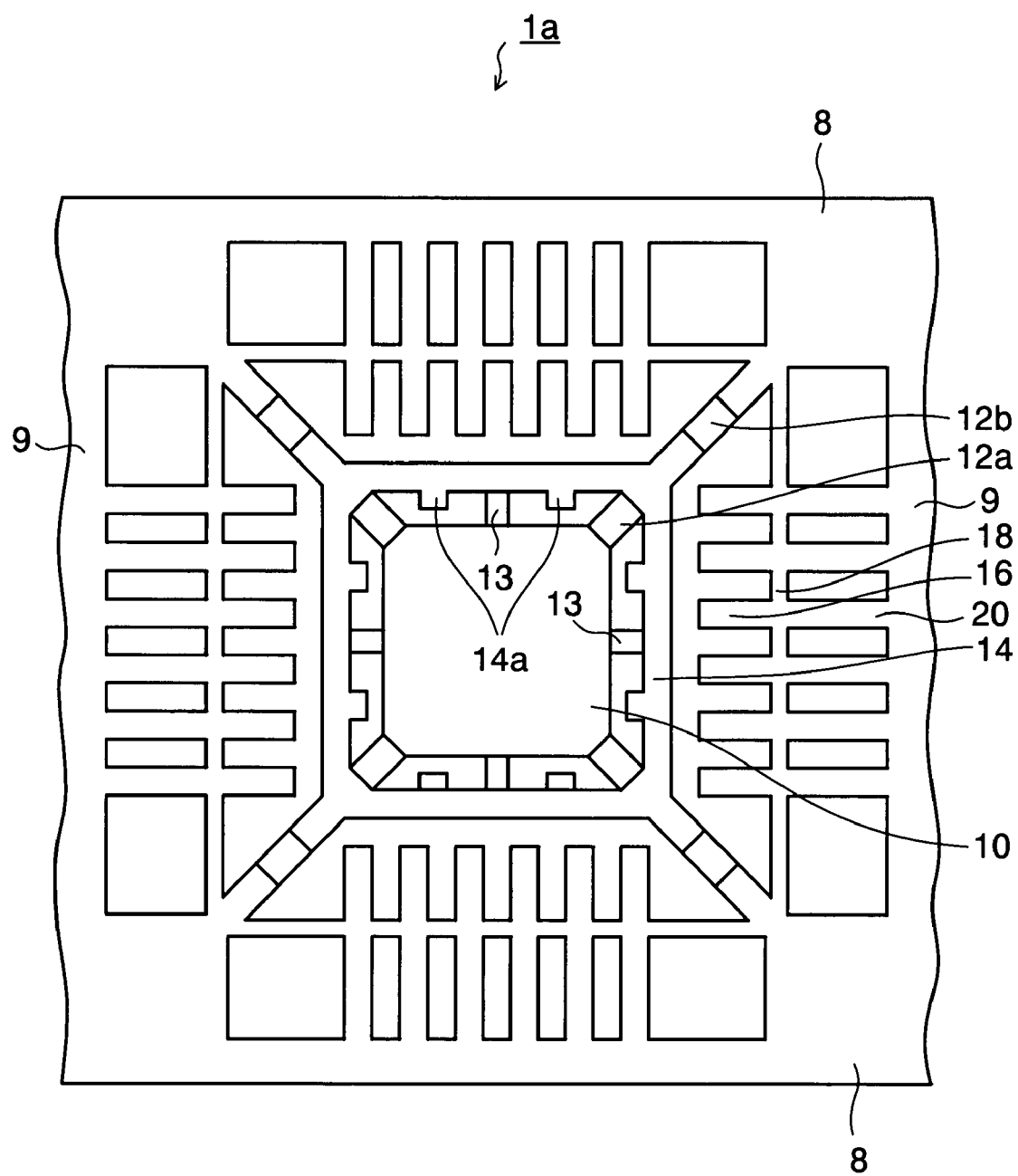
FIG. 10 is a plan view showing a lead frame according to a variation of the first embodiment of the present invention.

A lead frame 1a according to a variation of the present embodiment is shown in FIG. 10. As shown in FIG. 10, in the lead frame 1a of the variation, in addition to the inner support bars 12a connected to the ground ring 14 from four corners of the die pad 10, auxiliary connecting portions 13 connected to the ground ring 14 from center portions of four sides of the die pad 10 are formed respectively. Also, the projection portions 14a projected to the die pad 10 side are provided to areas between the auxiliary connecting portions 13 and the inner support bars 12a on the inner side portion of four sides of the ground ring 14 respectively.

In FIG. 10, remaining elements are similar to those in FIG. 5 and therefore their explanation will be omitted herein by affixing the same reference symbols to them. In the lead frame 1a of the variation, upon cutting off the inner leads 16 from the ground ring 14 by the die 30, the inner leads 16 are cut off under a condition that the projection portions 14a of the ground ring 14 are pressed partially by the die 30. Such a defect can be eliminated that the metal plating layer on the main body surface of the ground ring 14 is scratched or the ground ring 14 is twisted.

Second Embodiment

Figure 11:
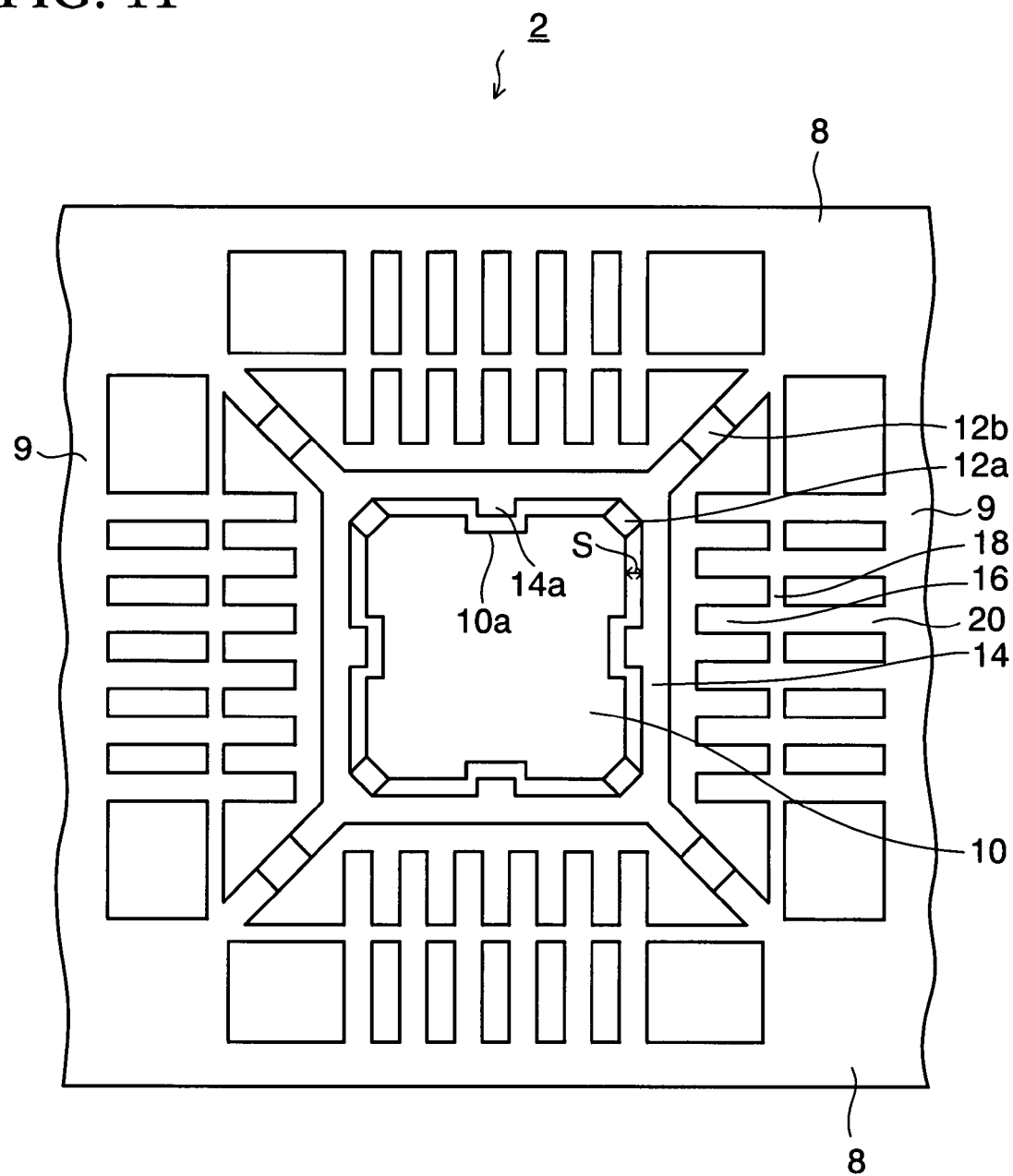
FIG. 11 is a plan view showing a lead frame according to a second embodiment of the present invention.

FIG. 11 is a plan view showing a lead frame according to a second embodiment of the present invention. In manufacturing the above lead frame 1 (FIG. 5) of the first embodiment, in the case that the interval S between the die pad 10 and the ground ring 14 is set to about 0.1 mm or less, in view of the fact that a minimum cutting width in the stamping or the etching is about 0.1 mm, it becomes difficult to provide the projection portion 14a whose projected dimension projected to the die pad 10 side is 0.05 to 0.1 mm to the ground ring 14. For this reason, as shown in FIG. 11, in a lead frame 2 of the second embodiment, a notched portion 10a cut into to the inner side is provided to the edge portion of the die pad 10 opposing to the projection portion 14a of the ground ring 14 respectively. Therefore, even when the interval S between the die pad 10 and the ground ring 14 is set to about 0.1 mm or less, an interval of 0.1 mm or more can be ensured between the projection portion 14a of the ground ring 14 and the notched portion 10a of the die pad 10 because the edge portion of the die pad 10 opposing to the projection portion 14a of the ground ring 14 is indented inward. In this manner, in the present embodiment, even though the interval between the die pad 10 and the ground ring 14 becomes narrow, the projection portion 14a having a predetermined projected dimension can be provided to the ground ring 14.

A difference of the second embodiment from the first embodiment is that the notched portions 10a are provided to the edge portions of the die pad 10. Therefore, explanation of remaining elements will be omitted by affixing the same reference symbols as those of FIG. 5 in the first embodiment.

Figure 12:
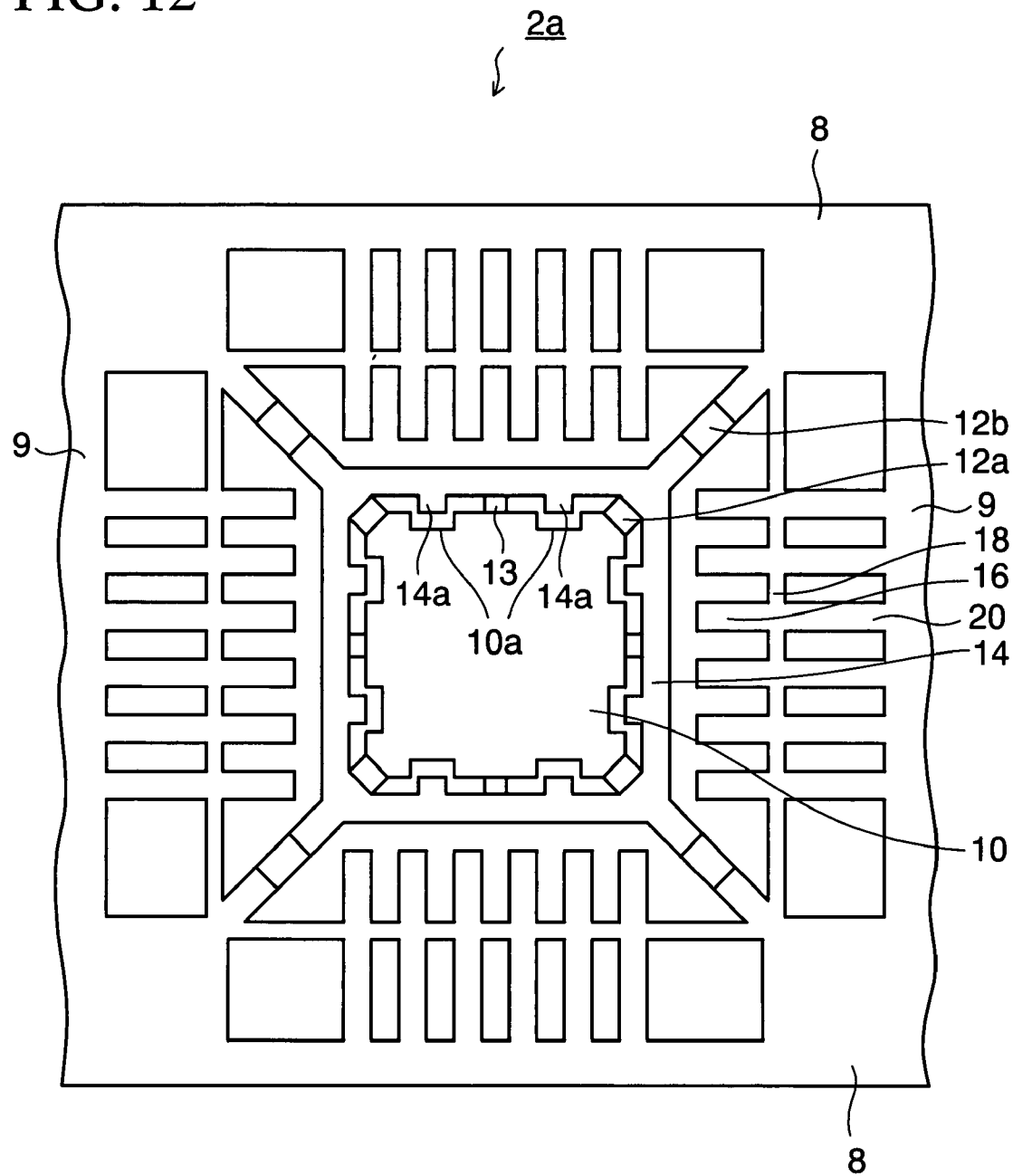
FIG. 12 is a plan view showing a lead frame according to a variation of the second embodiment of the present invention.

A lead frame 2a according to a variation of the second embodiment is shown in FIG. 12. In the lead frame 2a of this variation, the technical idea of the second embodiment is applied to the lead frame 1a of the variation of the first embodiment. As shown in FIG. 12, in the lead frame 1a (FIG. 10) of the variation of the first embodiment, when the interval between the die pad 10 and the ground ring 14 becomes narrow, a predetermined interval is ensured between the projection portion 14a of the ground ring 14 and the die pad 10, because similarly the notched portions 10a are provided to the edge portions of the die pad 10 opposing to the projection portions 14a of the ground ring 14.

Third Embodiment

Figure 13:
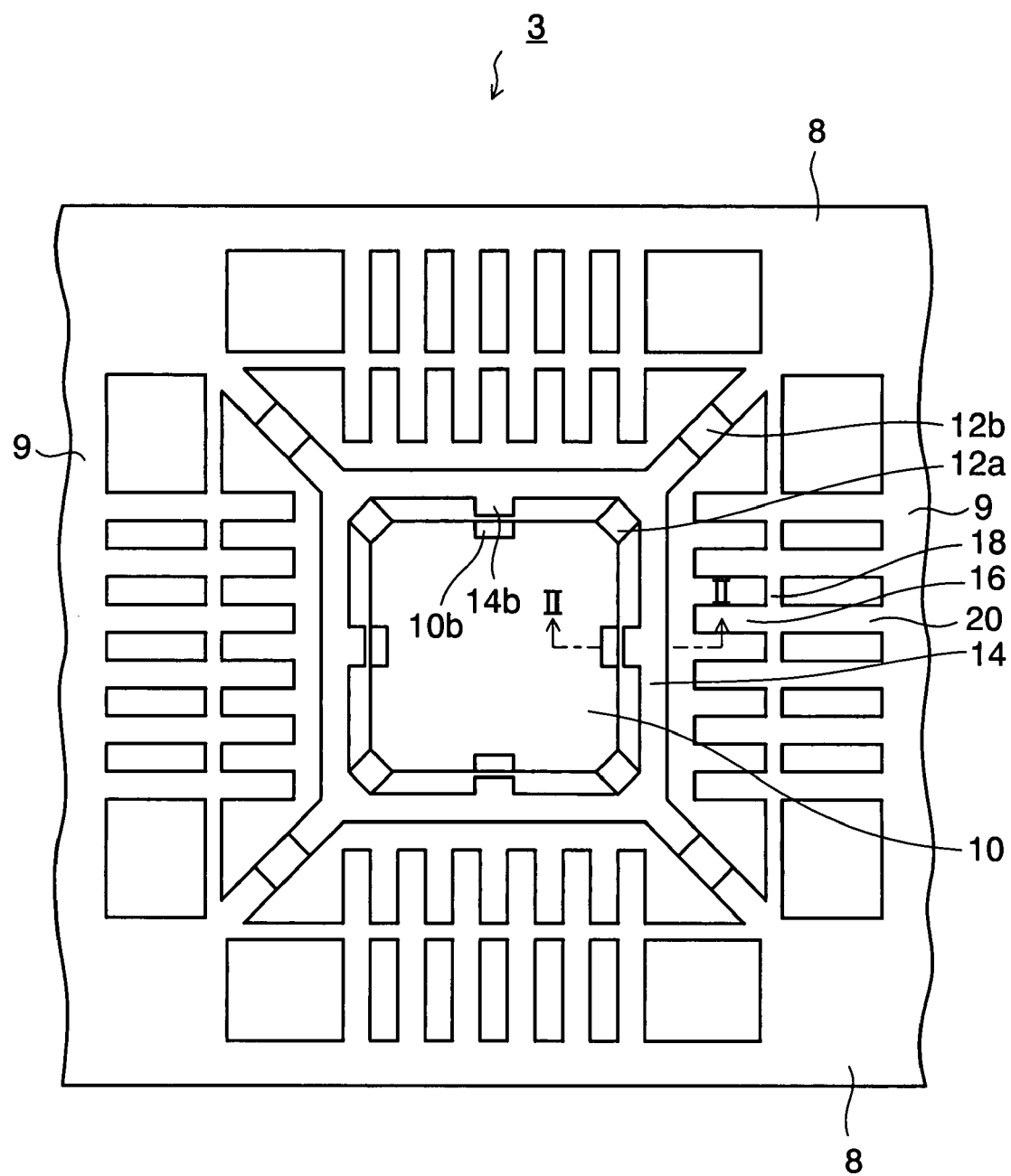
FIG. 13 is a plan view showing a lead frame according to a third embodiment of the present invention.
Figure 14:
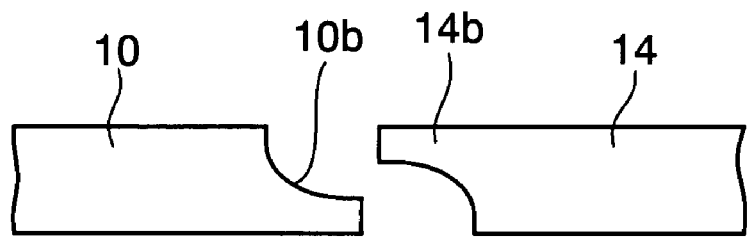
FIG. 14 is a partial sectional view taken along an II-II line in FIG. 13.
Figure 15:
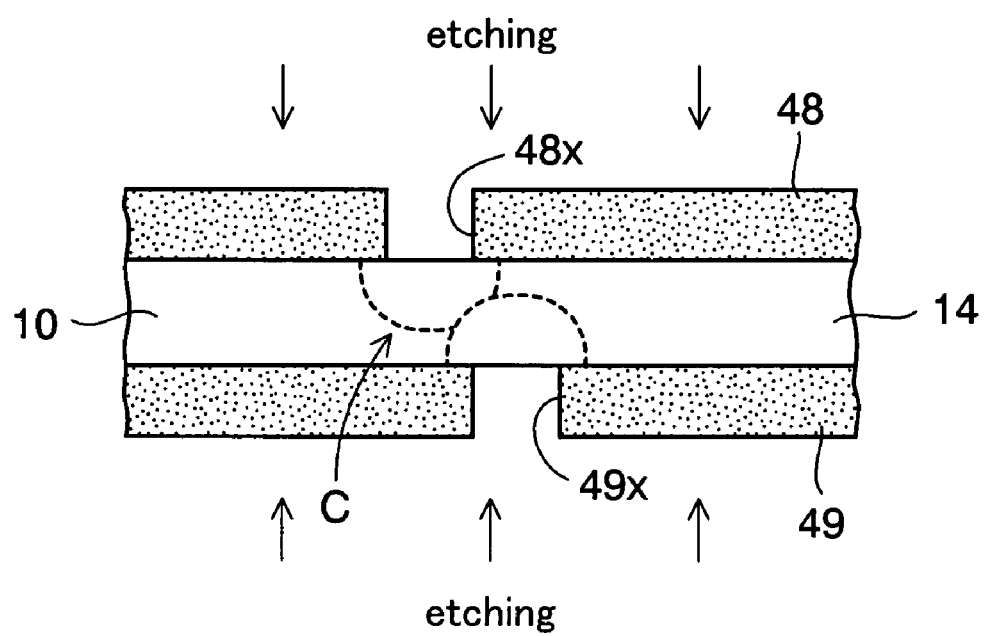
FIG. 15 is a sectional view showing a method of forming a projection portion of a ground ring in the lead frame according to the third embodiment of the present invention.

FIG. 13 is a plan view showing a lead frame according to a third embodiment of the present invention, FIG. 14 is a sectional view taken along an II-II line in FIG. 13, and FIG. 15 is a sectional view showing a method of forming the projection portion of a ground ring according to the third embodiment.

In the above second embodiment, the notched portions 10a are provided to the edge portions of the die pad 10 when the interval between the die pad 10 and the ground ring 14 becomes narrow. In the case that the semiconductor device of which the die pad 10 is exposed from the lower surface is constructed as shown in FIG. 9D, such semiconductor device looks like that the peripheral portion of the die pad 10 is broken off partially when viewed from the bottom side. Therefore, the case where the semiconductor device is undesirable in appearance is assumed.

As shown in FIG. 13 and FIG. 14, in a lead frame 3 of the third embodiment, a lower side of a projection portion 14b of the ground ring 14 is half-etched, thereby the lower side becomes a space, and the projection portion 14b is connected to the upper side in the thickness direction of the ground ring 14. Also, in the die pad 10 side, a hollow portion 10b is provided by half-etching the edge portion opposing to the projection portion 14b of the ground ring 14 from the upper surface.

In order to form such projection portion 14b, in forming the pattern-shaped metal plate 1x (FIG. 7) in which the inner leads 16 are connected to the ground ring 14 as explained in the first embodiment, first, a connecting portion C connected to the die pad 10 is provided to a portion in which the projection portion 14b of the ground ring 14 is provided, as shown in FIG. 15. Then, as also shown in FIG. 15, a first mask member 48 in which an opening portion 48x is provided on an upper surface portion of the die pad 10 side of the connecting portion C between the ground ring 14 and the die pad 10 is formed. Also, a second mask member 49 in which an opening portion 49x is provided on a lower surface portion of the ground ring 14 side of similarly the connecting portion C is formed.

Then, the wet etching is applied to the connecting portions C through the opening portions 48x, 49x in these mask members 48, 49 from both surfaces. At this time, the wet etching is applied until the etched surface of the connecting portion C extended from the upper surface side and the etched surface of the connecting portion C extended from the lower surface side are connected sufficiently mutually and two holes are communicated to each other. Accordingly, the wet etching proceeds to portions indicated by a chain line, and a structure shown in FIG. 14 can be obtained. Then, the first and second mask members 48, 49 are removed.

In this manner, in the third embodiment, even if the interval between the die pad 10 and the ground ring 14 is narrow (e.g., 0.1 mm or less), the projection portions 14b that project to the die pad 10 side from the side portion of the ground ring 14 are separated from the die pad 10 can be provided by etching the die pad 10 and the ground ring 14 from mutual deviated areas of the upper and lower surfaces of the connecting portions C respectively.

In the lead frame 3 of the third embodiment, the hollow portions 10b can be found when the die pad 10 is viewed from the upper surface side, but the hollow portions 10b cannot be found when the die pad 10 is viewed from the lower surface side. Therefore, the semiconductor device is desirable in appearance because an external appearance constitutes a quadrangular shape without the notched portion like the die pad 10 in the first embodiment when viewed from the bottom side.

Figure 16A:
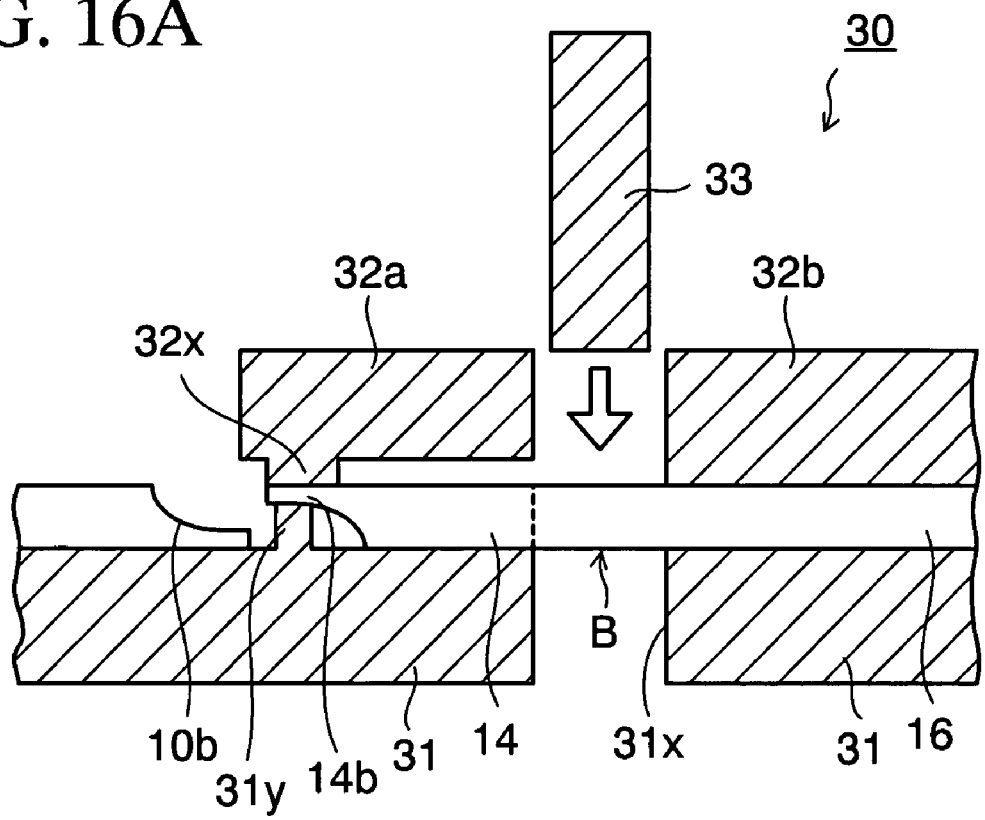
FIGS. 16A and 16B are sectional views showing a state to cut off inner leads from the ground ring by a die, in the lead frame manufacturing method according to the third embodiment of the present invention.

Also, even if the hollow portion 10b is provided to the edge portion of the die pad 10, a substantial area of the die pad 10 is set as designed. Therefore, an entering path of an outdoor air (moisture) into a center portion of the die pad 10 is prolonged rather than the case where the notched portion 10a is provided to the edge portion of the die pad 10 (second embodiment), and thus such structure is advantageous from an aspect of reliability in constructing the semiconductor device. In addition, even when a relatively large semiconductor chip is adhered to the die pad 10 by the adhesive, such a defect can be prevented that the adhesive leaks out downward because no notched portion is provided In the method of manufacturing the lead frame 3 of the third embodiment, the pattern-shaped metal plate in which the inner leads 16 are connected to the ground ring 14 and the inner and outer support bars 12a, 12b are not bent is prepared in the lead frame 3 in FIG. 13. Then, as shown in FIG. 16A, the die 30 having the supporting member 31 in which the opening portions 31x are provided, the first pressing member 32a, the second pressing member 32b, and the punch 33 is prepared. In the die 30 used in the third embodiment, projected supporting portions 31y that come into touch with the lower surface (half-etched surface) of the projection portion 14b of the ground ring 14 are provided to the supporting member 31 on which the ground ring 14 is placed. Also, like the first embodiment, the convex pressing portions 32x for pressing partially the projection portions 14b of the ground ring 14 are provided to the first pressing member 32a.

Also, like the first embodiment, the pattern-shaped metal plate in which the inner leads 16 are connected to the ground ring 14 is placed on the supporting member 31 of the die 30. At this time, the half-etched surfaces on the back surfaces of the projection portions 14b of the ground ring 14 are on the projected supporting portions 31y of the supporting member 31, and the root portions B of the inner leads 16 connected to the ground ring 14 are placed on the opening portions 31x. Then, the projection portions 14b of the ground ring 14 are pressed partially by the convex pressing portions 32x of the first pressing member 32a. Then, the areas on the inner leads 16 side are pressed by the second pressing member 32b.

Figure 16B:
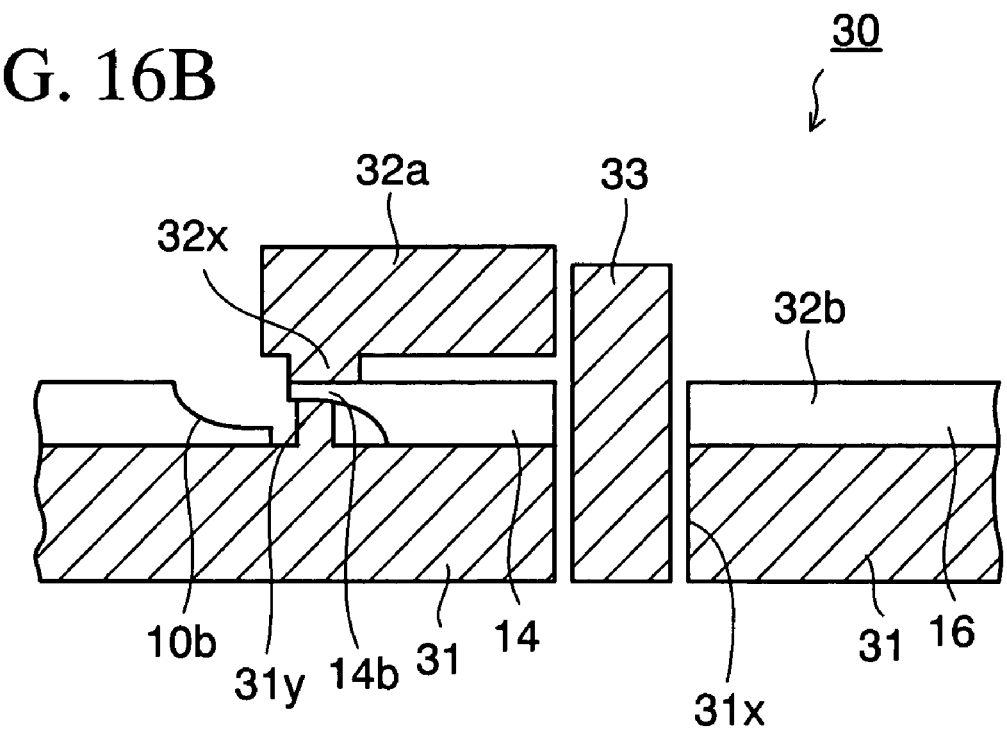

Then, as shown in FIG. 16B, the root portions B of the inner leads 16 are punched out by moving the punch 33 downward to cut off the inner leads 16. Then, the lead frame 3 of the third embodiment can be obtained by executing the similar manufacturing steps to those in the first embodiment.

In the third embodiment, the projection portions 14b are provided to the ground ring 14, and then the projection portions 14b of the ground ring 14 are pressed partially and fixed in cutting off the inner leads 16 from the ground ring 14 by the die. Therefore, such a defect can be eliminated that the main body portion of the ground ring 14 is scratched or twisted.

Figure 17:
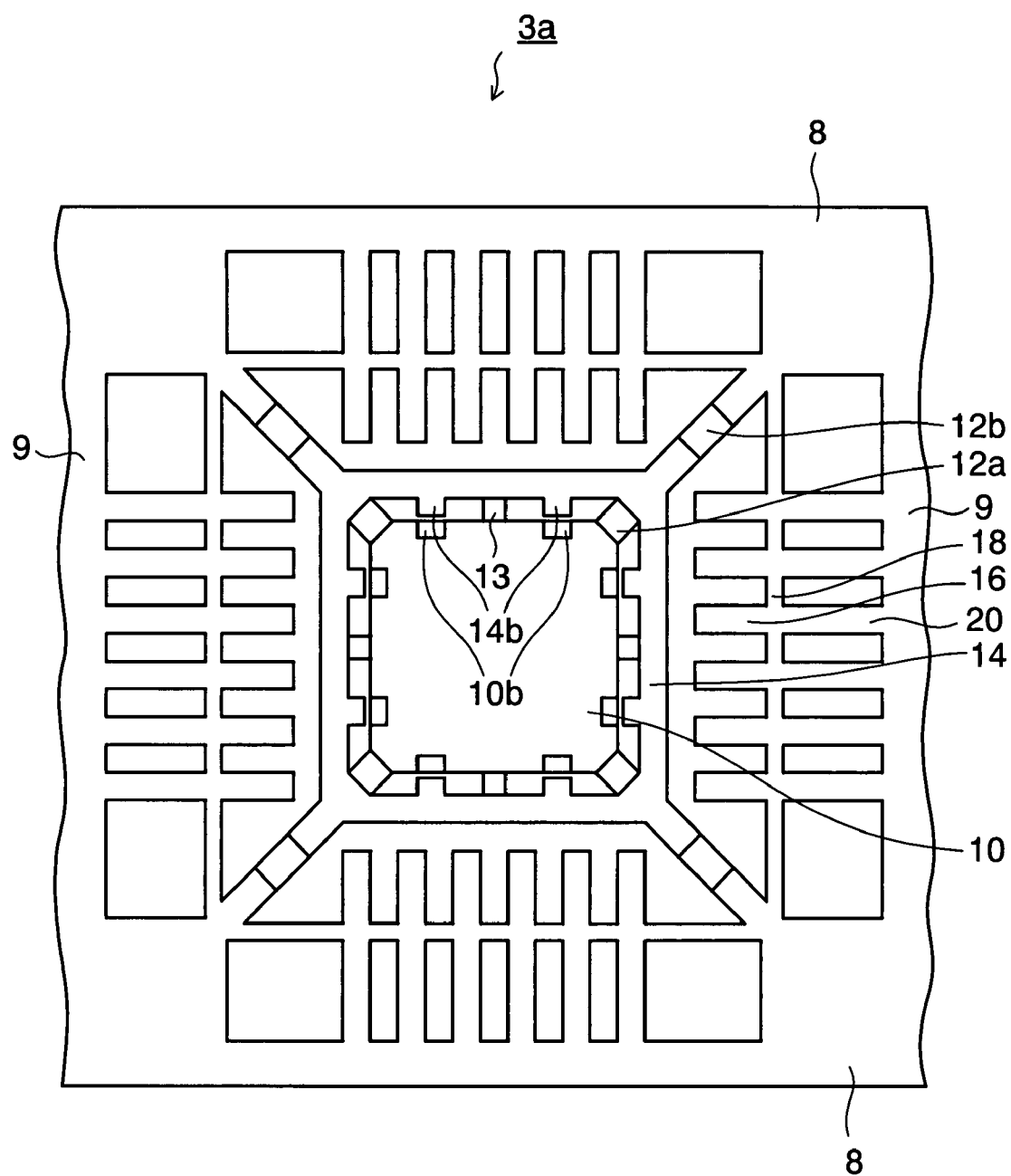
FIG. 17 is a plan view showing a lead frame according to a variation of the third embodiment of the present invention.

A lead frame 3a according to a variation of the third embodiment is shown in FIG. 17. In the lead frame 3a of the variation, the technical idea of the third embodiment is applied to the lead frame 2a of the variation of the second embodiment. As shown in FIG. 17, in the lead frame 2a (FIG. 12) of the variation of the second embodiment, in the case that the notched portions 10a on the edge portions of the die pad 10 are undesirable in appearance when viewed from the lower surface side, as described above, the projection portions 14b formed by applying the half etching from the lower surface may be provided to the ground ring 14 and the hollow portion 10b formed by applying the half etching from the upper surface may be provided to the edge portions of the die pad 10 opposing to the projection portions 14b.

The invention claimed is:

1. A lead frame, comprising:
   a die pad;
   a common wiring portion arranged around the die pad with a predetermined interval, and connected partially to the die pad, and in which projection portions projected toward the die pad side are provided at side portions of the common wiring portion; wherein the ends of the projection portions are separated from the die pad; and
   a plurality of leads provided to be separated from the common wiring portion, and extending outward from a periphery of the common wiring portion.

2. A lead frame according to claim 1, wherein the die pad is formed like a quadrangular shape, the common wiring portion is connected to be formed like a ring to surround the die pad, and the projection portions are provided to four sides of the common wiring portion.

3. A lead frame according to claim 2, wherein support bars connected to an outer frame via four corners of the common wiring portion are provided to extend outward from four corners of the die pad, and the die pad and the common wiring portion are connected partially by the support bars.

4. A semiconductor device, comprising:
   a mounted body constructed by the die pad, the common wiring portion, and the leads having inner leads and outer leads, which are obtained from the lead frame set forth in claim 3;
   a semiconductor chip mounted on the die pad;
   wires for connecting the semiconductor chip to the common wiring portion and the inner leads respectively; and
   a resin portion for sealing the semiconductor chip, the inner leads, and the wires in a state that a lower surface of the die pad and the outer leads are exposed.

5. A lead frame according to claim 2, further comprising:
   auxiliary connecting portions connected to the common wiring portion from center portions of four sides of the die pad;
   wherein the projection portions of the common wiring portion are provided to areas between the support bars and the auxiliary connecting portions.

6. A semiconductor device, comprising:

a mounted body constructed by the die pad, the common wiring portion, and the leads having inner leads and outer leads, which are obtained from the lead frame set forth in claim 5;

a semiconductor chip mounted on the die pad;

wires for connecting the semiconductor chip to the common wiring portion and the inner leads respectively; and a resin portion for sealing the semiconductor chip, the inner leads, and the wires in a state that a lower surface of the die pad and the outer leads are exposed.

7. A semiconductor device, comprising:

a mounted body constructed by the die pad, the common wiring portion, and the leads having inner leads and outer leads, which are obtained from the lead frame set forth in claim 2;

a semiconductor chip mounted on the die pad;

wires for connecting the semiconductor chip to the common wiring portion and the inner leads respectively; and a resin portion for sealing the semiconductor chip, the inner leads, and the wires in a state that a lower surface of the die pad and the outer leads are exposed.

8. A lead frame according to claim 1, wherein, notched portions cut into an inside are provided to edge portions of the die pad opposing to the projection portions of the common wiring portion.

9. A semiconductor device, comprising:

a mounted body constructed by the die pad, the common wiring portion, and the leads having inner leads and outer leads, which are obtained from the lead frame set forth in claim 8;

a semiconductor chip mounted on the die pad;

wires for connecting the semiconductor chip to the common wiring portion and the inner leads respectively; and a resin portion for sealing the semiconductor chip, the inner leads, and the wires in a state that a lower surface of the die pad and the outer leads are exposed.

10. A lead frame according to claim 1, wherein the projection portions of the common wiring portion are formed by etching a lower surface side to be connected to an upper surface side of the common wiring portion in a thickness direction, and hollow portions are provided to edge portions of the die pad opposing to the projection portions by etching an upper surface side of the die pad.

11. A semiconductor device, comprising:

a mounted body constructed by the die pad, the common wiring portion, and the leads having inner leads and outer leads, which are obtained from the lead frame set forth in claim 10;

a semiconductor chip mounted on the die pad;

wires for connecting the semiconductor chip to the common wiring portion and the inner leads respectively; and a resin portion for sealing the semiconductor chip, the inner leads, and the wires in a state that a lower surface of the die pad and the outer leads are exposed.

12. A semiconductor device, comprising:

a mounted body constructed by the die pad, the common wiring portion, and the leads having inner leads and outer leads, which are obtained from the lead frame set forth in claim 1;

a semiconductor chip mounted on the die pad;

wires for connecting the semiconductor chip to the common wiring portion and the inner leads respectively; and a resin portion for sealing the semiconductor chip, the inner leads, and the wires in a state that a lower surface of the die pad and the outer leads are exposed.

* * * * *